US007643311B2

(12) United States Patent
Coffy

(10) Patent No.: US 7,643,311 B2
(45) Date of Patent: Jan. 5, 2010

(54) ELECTRONIC CIRCUIT PROTECTION DEVICE

(75) Inventor: Romain Coffy, La Tronche (FR)

(73) Assignee: STMicroelectronics SA, Montrouge (FR)

( * ) Notice: Subject to any disclaimer, the term of this patent is extended or adjusted under 35 U.S.C. 154(b) by 598 days.

(21) Appl. No.: 11/407,854

(22) Filed: Apr. 20, 2006

(65) Prior Publication Data

US 2006/0274517 A1 Dec. 7, 2006

(30) Foreign Application Priority Data

Apr. 21, 2005 (FR) .................................. 05 51018

(51) Int. Cl.
*H05K 9/00* (2006.01)

(52) U.S. Cl. ....................... 361/818; 361/753; 361/799; 361/800; 361/816; 174/350; 29/825; 29/830; 29/850; 257/659; 257/660

(58) Field of Classification Search ................. 361/753, 361/799, 800, 816, 818; 174/350; 257/659, 257/660; 29/825, 830, 850; 333/12
See application file for complete search history.

(56) References Cited

U.S. PATENT DOCUMENTS 4,658,334 A * 4/1987 McSparran et al. ......... 361/800
5,423,080 A * 6/1995 Perret et al. ................ 455/90.3
5,475,255 A * 12/1995 Joardar et al. ............... 257/547
5,639,989 A 6/1997 Higgins, III ........... 174/35 MS
5,694,300 A 12/1997 Mattei et al. ................ 361/818
6,472,598 B1 * 10/2002 Glenn ........................ 174/535
6,686,649 B1 * 2/2004 Mathews et al. ............ 257/659
7,049,682 B1 * 5/2006 Mathews et al. ............ 257/660
7,109,410 B2 * 9/2006 Arnold et al. ............... 174/390
7,187,060 B2 * 3/2007 Usui .......................... 257/659
7,282,906 B2 * 10/2007 Coffy ...................... 324/158.1
7,327,015 B2 * 2/2008 Yang et al. .................. 257/660
7,443,693 B2 * 10/2008 Arnold et al. ............... 361/800
2004/0178500 A1 * 9/2004 Usui .......................... 257/734
2005/0056925 A1 3/2005 Takehara et al. ............ 257/702

FOREIGN PATENT DOCUMENTS

DE 10065896 A1 5/2002

* cited by examiner

*Primary Examiner*—Dameon E Levi
(74) *Attorney, Agent, or Firm*—Lisa K. Jorgenson; Robert Iannucci; Seed IP Law Group PLLC

(57) ABSTRACT

An electronic device protected against electromagnetic disturbances comprising: a support structure having a first and second electronic component, wherein the support structure includes a conductive means surrounding each of the first and second electronic components; a first and second insulating block formed overlying the first and second electronic components on the support structure; and a metal layer overlying the first and second insulating blocks that are formed over the first and second electronic components, wherein the metal layer is electrically connected to the support structure through the conductive means to protect the first and second electronic components from the electromagnetic disturbances irradiating from each of the first and second electronic components.

14 Claims, 4 Drawing Sheets

ELECTRONIC CIRCUIT PROTECTION DEVICE

BACKGROUND OF THE INVENTION

1. Field of the Invention

The present invention relates to a device for protecting an electronic circuit and a method for forming such a device.

2. Description of the Related Art

Many electronic circuits, for example for cell phones, are formed by attaching to a main support, generally called a motherboard, elementary electronic circuits formed separately, each fulfilling a specific function. As an example, for a cell phone, an elementary electronic circuit corresponds to a radio transceiver circuit, to be connected to the cell phone antenna, which demodulates the signals received at the antenna level and modulates the signals to be transmitted. Another elementary electronic circuit corresponds to a power amplifier circuit for amplifying the signals to be transmitted provided by the radio transceiver circuit. Each elementary electronic circuit is formed on a distinct support, for example, a ball grid array (BGA) or a land grid array (LGA) casing.

Some elementary electronic circuits may be sensitive to electromagnetic disturbances. Such is the case, for example, for the radio transceiver circuit of a cell phone which is generally attached to the motherboard, like the power amplifier circuit, close to the antenna. In particular, the proper operation of the radio transceiver circuit may be disturbed by the electromagnetic disturbances transmitted by the power amplifier circuit and other external circuits.

FIG. 1 shows a conventional example of protection of an elementary electronic circuit against electromagnetic disturbances. In FIG. 1, a portion of a motherboard 10 on which an elementary electronic circuit 12 is welded has been shown in cross-section view. As an example, elementary electronic circuit 12 is formed of a BGA package 14, welded to motherboard 10 via bumps 16. Elementary electronic circuit 12 comprises an integrated circuit 18, attached to package 14 by a glue layer 20. Electric wires 22, for example, made of gold, ensure an electric connection between chip 18 and BGA package 14. A resin block 24 covers integrated circuit 18 and protects it against mechanical shocks.

To protect integrated circuit 18 against electromagnetic disturbances, a metal cover 26, welded to motherboard 10 and which encapsulates circuit 12, is provided. Cap 26 is grounded via motherboard 10. Generally, it is necessary to provide a metal cover such as described in FIG. 1 for each elementary electronic circuit to be protected against electromagnetic disturbances.

The current tendency is to integrate on a same elementary electronic circuit several functions previously performed by separate elementary circuits. As an example, in mobile telephony, it may be desirable to form a single elementary electronic circuit which integrates the functions previously performed by the transceiver circuit and the power amplifier circuit. This may be obtained by arranging several integrated circuits on a same BGA package, a same LGA package, or another type of package.

A difficulty then is to protect certain components of such an elementary electronic circuit against electromagnetic disturbances transmitted by other components of the same elementary electronic circuit. Indeed, the arranging of metal covers directly at the level of the elementary electronic circuit is generally incompatible with conventional methods for manufacturing such circuits.

BRIEF SUMMARY OF THE INVENTION

One embodiment of the present invention protects a portion of an electronic circuit, comprising at least one integrated circuit, against electromagnetic disturbances transmitted by another portion, comprising at least another integrated circuit, of the same electronic circuit and against electromagnetic disturbances originating from other electronic circuits.

One embodiment of the present invention provides a device of connection of an electronic circuit to an external element having a manufacturing process compatible with current methods for manufacturing electronic circuits.

One embodiment of the present invention is to provide a device of connection of an electronic circuit to an external element having a manufacturing process which only slightly modifies current electronic circuit manufacturing processes.

For this purpose, one embodiment of the present invention provides a device for protecting an electronic circuit, comprising a support to which are attached at least two circuit portions, each comprising at least one integrated circuit chip. Each circuit portion is covered with an insulating block, itself covered with a metal layer connected to the support.

According to an embodiment of the present invention, the support is intended to be attached to a base, the support comprising means of electric connection of the metal layers to a terminal at the base reference voltage.

According to another embodiment of the present invention, the device comprises conductive strips attached to the support and surrounding each circuit portion, the metal layers being connected to the support via conductive strips.

According to yet another embodiment of the present invention, the support comprises a planar insulating portion and means, contained in the planar portion, for connecting first conductive tracks arranged on a surface of the planar portion and second conductive tracks arranged on the opposite surface, the conductive strips being in contact with at least one conductive track, among the first conductive tracks, connected to a conductive track, among the second conductive tracks, intended to be connected to a source of a reference voltage.

According to an embodiment of the present invention, the metal layers have at least one common wall.

According to an embodiment of the present invention, the metal layers have opposite walls.

According to an embodiment of the present invention, the support is a ball grid array.

One embodiment of the present invention provides a method for manufacturing an electronic circuit, comprising the steps of:

(a) providing a wafer;

(b) attaching to the wafer circuit portions, each containing at least one integrated circuit chip;

(c) covering with an insulating layer;

(d) forming, in the insulating layer, recesses which surround each circuit portion and delimit an insulating block covering each circuit portion;

(e) covering the obtained structure with a metal layer; and (f) delimiting electronic circuits, each comprising at least two adjacent circuit portions.

According to an embodiment of the present invention, step (b) is preceded or followed by a step of forming conductive strips on the support surrounding each circuit portion, the recesses being formed at step (d) to expose the conductive strips, whereby, at step (e), the metal layer is in contact with the conductive strips.

According to an embodiment of the present invention, the recesses are formed by sawing.

According to one embodiment, the electronic device protected against electromagnetic disturbances includes: a support structure having an electronic circuit, wherein the support structure includes a conductive means surrounding the electronic circuit; an insulating block formed overlying the electronic circuit on the support structure; and a metal layer overlying the insulating block that is formed over the electronic circuit, wherein the metal layer is electrically connected to the support structure through the conductive means and is protected from electromagnetic disturbances.

According to another embodiment the electronic device protected against electromagnetic disturbances includes: a support structure having a first and second electronic component, wherein the support structure includes a conductive means surrounding each of the first and second electronic components; a first and second insulating block formed overlying the first and second electronic components on the support structure; and a metal layer overlying the first and second insulating blocks that are formed over the first and second electronic components, wherein the metal layer is electrically connected to the support structure through the conductive means to protect the first and second electronic components from the electromagnetic disturbances irradiating from each of the first and second electronic components.

The foregoing and other features and advantages of the present invention will be discussed in detail in the following non-limiting description of specific embodiments in connection with the accompanying drawings.

DETAILED DESCRIPTION OF THE INVENTION

Figure 1:
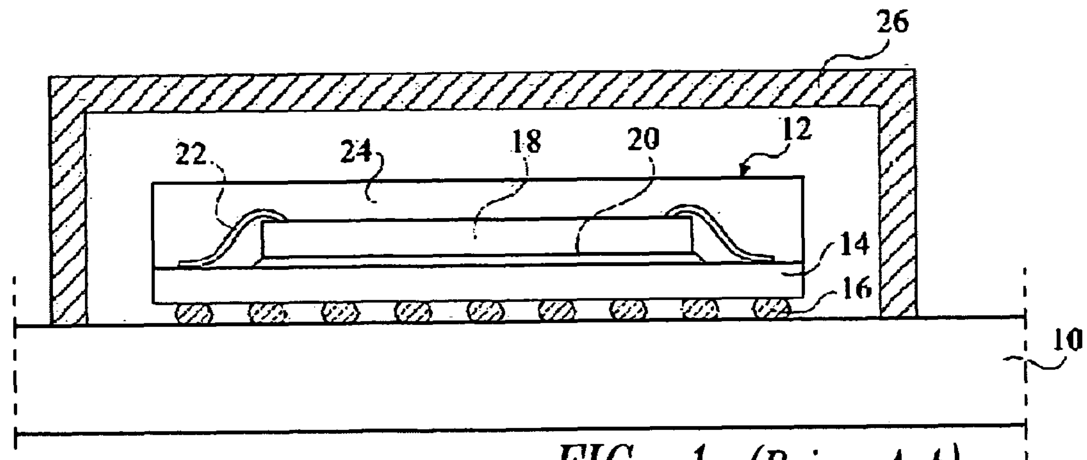
FIG. 1, previously described, shows a conventional device for protecting an electronic circuit, attached to a support, against electromagnetic disturbances, according to one illustrative embodiment.

For clarity, same elements have been designated with same reference numerals in the different drawings and, further, as usual in the representation of integrated circuits, the various drawings are not to scale.

FIGS. 2 to 8 illustrate successive steps of a first example of embodiment of a method according to the present invention for manufacturing an electronic circuit protected against disturbances.

Figure 2:
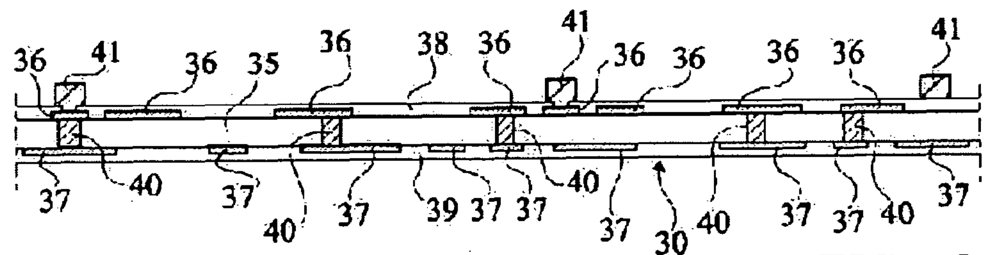
FIGS. 2 to 8 illustrate successive steps of a first example of a method for protecting an electronic circuit against electromagnetic disturbances, according to one illustrative embodiment.

FIG. 2 is a cross-section view of a support 30 from which Ball Grid Array (BGA) packages on which electronic circuits will be formed must be obtained. At such a step of the manufacturing method, support 30 has the shape of a wafer formed of a central layer 35 made of an insulating material. Metal tracks 36, 37 are arranged on each surface of central layer 35 and are covered with an insulating layer 38, 39. Metal vias 40 are formed in central layer 35, each via 40 connecting a metal track 36 arranged on a surface of central layer 35 with a metal track 37 arranged on the other surface of central layer 35.

Figure 3:
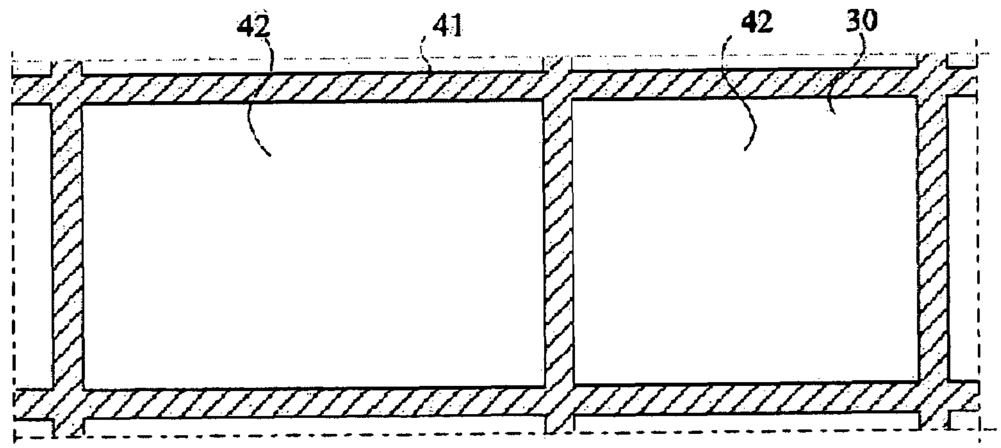

FIGS. 2 and 3 respectively are a cross-section view and a top view of the structure obtained after having locally etched insulating layer 38 to expose portions of metal tracks 36 and after having formed on support 30 conductive tracks 41 in contact with exposed metal tracks 36. In top view, conductive strips 41 form a grid on support 30 delimiting locations 42, one or several integrated circuits being intended to be attached to support 30 at the level of each location 42. As an example, conductive strips 41 are made of a welding paste and have a thickness of approximately 60 μm and a width of some hundred micrometers. As an example, conductive strips 41 may be formed by spreading welding paste on a mask arranged opposite to support 30. In this case, conductive strips 41 may be locally interrupted to ease the forming of such a mask. When openings are present at the level of conductive strips 41, the number and the dimensions of such openings depend on the nature of the expected electromagnetic disturbances.

Simultaneously to the forming of conductive strips 41, insulated welding paste pads (not shown) may be formed on support 30, such pads being in contact with metal tracks 36. Such insulated pads enable, conventionally, arranging discrete electronic components, generally called SMDs (Surface Mounted Device). Such components correspond, for example, to capacitors or to resistors which cannot be made in integrated form.

Figure 4:
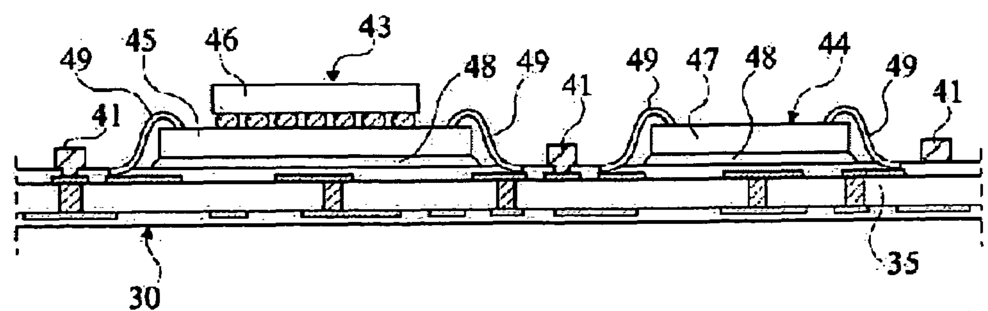

FIG. 4 is a cross-section view of the structure obtained after attachment of electronic circuits 43, 44 at the level of locations 42. In FIG. 4, the two shown circuits 43, 44 are attached at the level of two adjacent locations 42 and are intended, at the end of the manufacturing process, to be on a same portion of support 30. However, at the present step of the manufacturing process, circuits 43, 44 are reproduced many times on support 30. As an example, circuit 43 is a transceiver circuit formed of a first integrated circuit chip 45 and of a second integrated circuit chip 46 attached to the first integrated circuit chip 45 according to a flip/chip-type connection, and circuit 44 is a power amplifier circuit formed of an integrated circuit chip 47. The attachment of circuits 43, 44 to support 30 is obtained by depositing glue portions 48 on support 30, by laying circuits 43, 44 at the level of glue portions 48, and by polymerizing glue portions 48. The electric connections between circuits 43, 44 and support 30 are obtained via electric wires 49, for example, made of gold, connected to metal tracks 36 through insulating layer 38. It should be clear that the structures of circuits 43, 44 are given as an illustration only, since circuits 43, 44 may comprise a greater or smaller number of integrated circuit chips.

Figure 5:
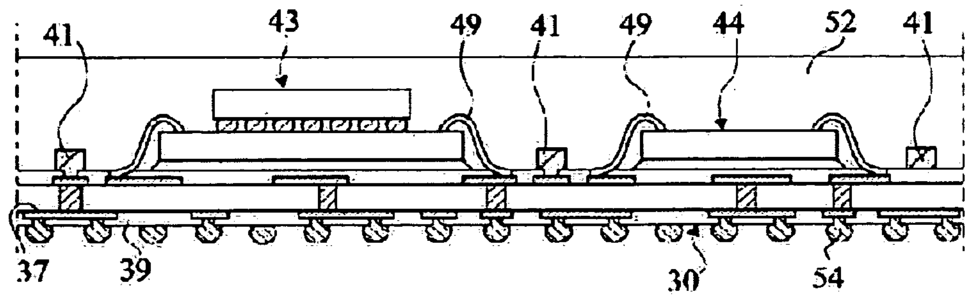

FIG. 5 illustrates the circuit obtained after having deposited a resin layer 52, for example, an epoxy resin, on support 30 and electronic circuits 43, 44 and after having formed bumps 54, for example, made of tin, on the surface of support 30 opposite to circuits 43, 44. As an example, resin layer 52 has a thickness of approximately 0.8 mm. Some bumps 54 are connected to metal tracks 37 of support 30, through resin layer 39, enabling forming of electric connections between bumps 54 and electric wires 49 and between bumps 54 and conductive strips 41.

Figure 6:
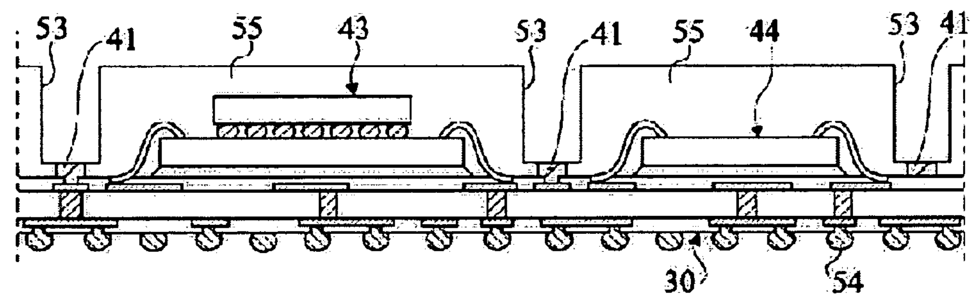

FIG. 6 shows the structure obtained after having formed recesses 53 in resin layer 52 exposing the upper portion of conductive strips 41. Recesses 53 thus follow the distribution of conductive tracks 41 and delimit distinct resin blocks 55 at the level of each circuit 43, 44. Recesses 53 have a width greater than the width of conductive tracks 41. As an example, recesses 53 may be formed by sawing of resin layer 52 down to part of the depth of resin layer 52, for example, by means of a circular saw having a thickness of approximately 250 μm. In FIG. 6, recesses 53 are shown with a constant cross-section. According to an alternative embodiment, recesses 53 having a cross-section comprising several successive stages or a "V"-shaped cross-section, the bottom of a recess 54 exposing the upper portion of a conductive strip 41.

Figure 7:
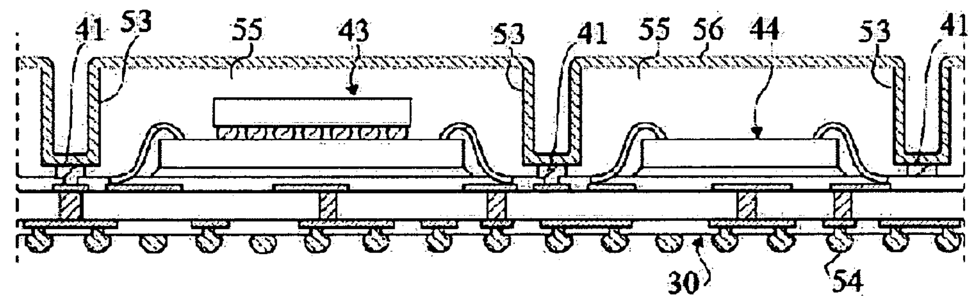

FIG. 7 illustrates the structure obtained after having covered resin blocks 55 with a metal layer 56 which penetrates into recesses 53 and comes into contact with conductive strips 41. Metal layer 56 may be formed by a metal deposition, for example, by a cathode sputtering. The metal forming metal layer 56 may be gold or silver. Generally, it is a metal or a metal alloy that can be only weakly oxidized, or the oxidation of which only slightly affects the conduction properties. The thickness of metal layer 56, on the order of a few micrometers, depends on the used material and on the nature of the electromagnetic disturbances against which a protection is desired to be obtained. Further, the thickness of metal layer 56 may not be constant, in particular at the level of recesses 53.

According to an alternative embodiment of the present invention, after deposition of metal layer 56, an additional step of filling of recesses 53 with an insulating material, for example, a resin, is provided. According to another alternative embodiment, recesses 53 are completely filled with metal.

Figure 8:
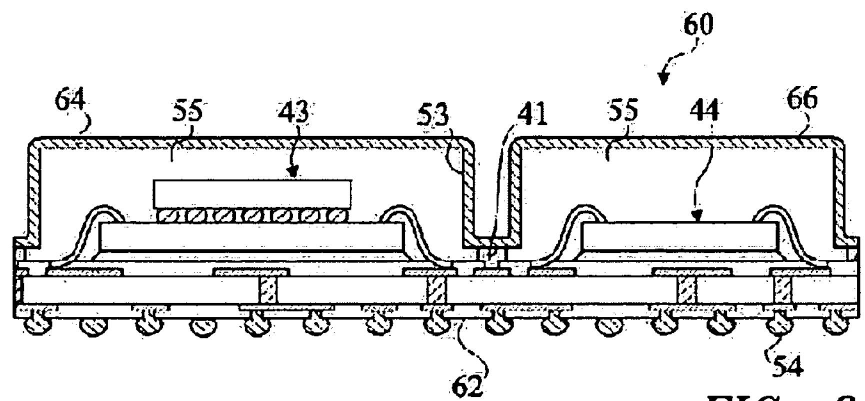

FIG. 8 shows the structure obtained after sawing of support 30, of some conductive strips 41, and of metal layer 56 to obtain distinct electronic circuits 60, a single circuit 60 being shown. Each electronic circuit 60 is formed, in the present example, of a portion 62 of support 30 on which are attached circuits 43 and 44, each circuit being completely surrounded with a metal cage 64, 66 corresponding to a portion of metal layer 56. The sawing of circuits 60 may be performed by means of a circular saw having a thickness smaller than the thickness of the circular saw used to form recesses 53, for example, on the order of 100 μm.

Electronic circuit 60 is, for example, intended to be attached to a motherboard. Metal cages 64, 66 may then be grounded via conductive strips 41 connected to bumps 54, themselves grounded via the motherboard. Each metal cage 64, 66 then protects the electronic circuit 43, 44 that it contains against external electromagnetic disturbances, especially electromagnetic disturbances originating from the other circuit 43, 44 attached to the same portion 62 of support 30.

FIGS. 9 to 13 illustrate successive steps of a second example of embodiment of the protection method according to the present invention.

Figure 9:
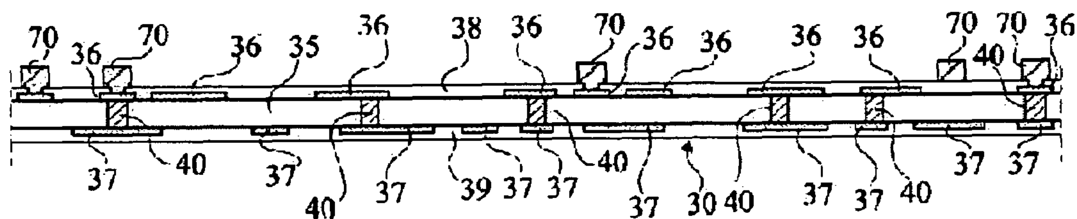
FIGS. 9 to 13 illustrate successive steps of a second example of a method for protecting an electronic circuit against electromagnetic disturbances, according to one illustrative embodiment.
Figure 10:
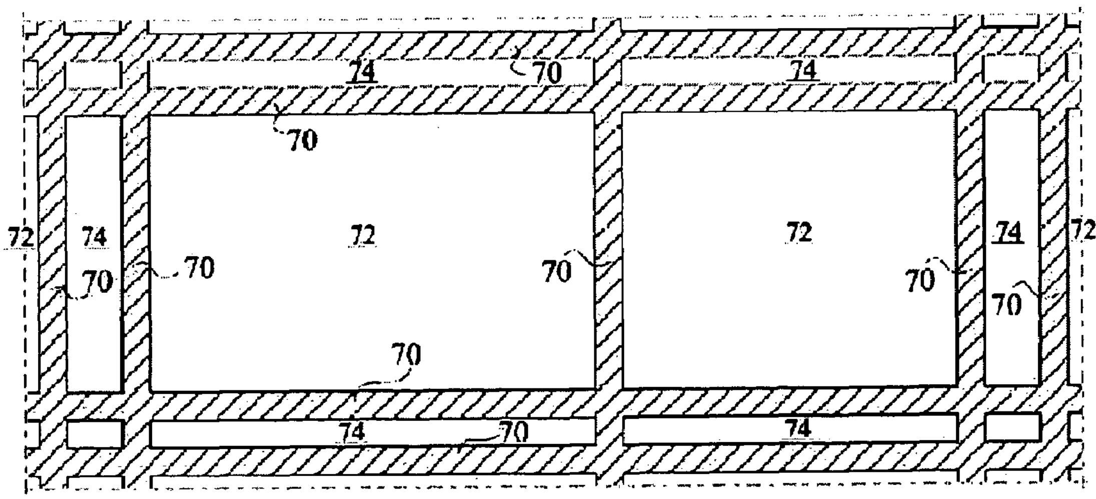

FIGS. 9 and 10 are similar to FIGS. 2 and 3 since conductive strips 70 are distributed on support 30 in the form of a grid which delimits locations 72. Like in the first example of embodiment, two adjacent locations 72 at the level of which circuits intended to be located on a same portion of support 30 will be attached are separated by a single conductive strip 70. However, unlike the first example of embodiment, two adjacent locations 72 at the level of which circuits intended to be on two distinct portions of support 30 will be attached are separated by two parallel conductive strips 70, separated by an interval 74.

The next steps of attachment of circuits 43, 44 and of deposition of resin layer 52 are identical to what has been previously described for the first example of embodiment.

Figure 11:
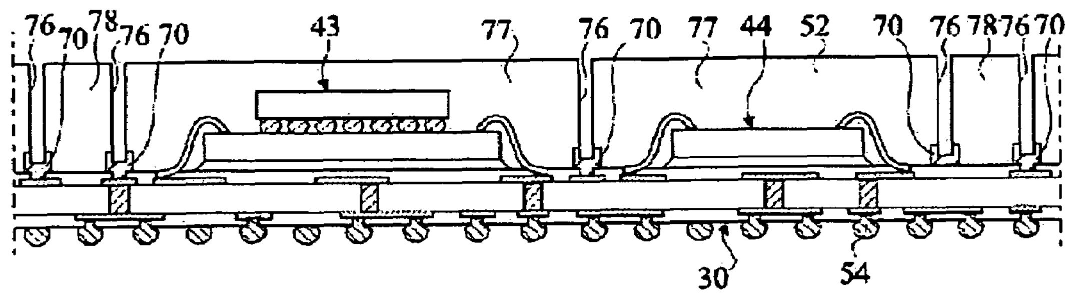

FIG. 11 shows the structure obtained after having formed recesses 76 in resin layer 52 partially penetrating into conductive strips 70. Recesses 76 thus follow the distribution of conductive strips 70 and delimit resin blocks 77 at the level of each circuit 43, 44 and resin blocks 78 at the level of intervals 74 between two adjacent conductive tracks 70. As an example, recesses 76 may be formed by sawing of resin layer 52 down to part of the depth of resin layer 52, for example, by means of a circular saw having a thickness of approximately 100 μm.

Figure 12:
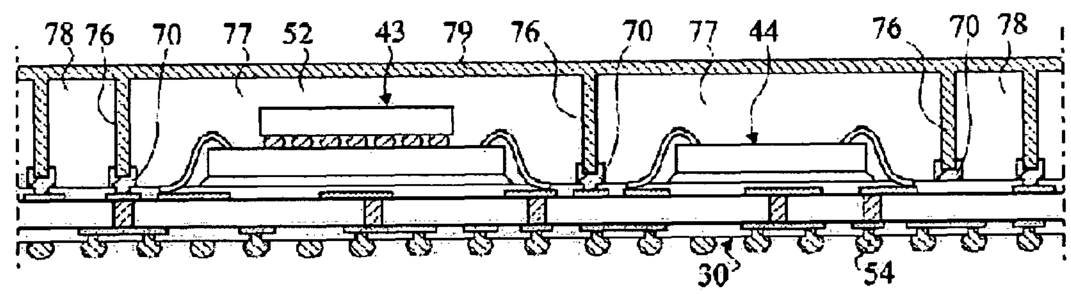

FIG. 12 illustrates the structure obtained after having covered resin blocks 77, 78 with a metal layer 79, which penetrates into recesses 76 and comes into contact with conductive strips 70. The determination of the thickness and of the nature of metal layer 79 follows what has been previously discussed for metal layer 56.

Figure 13:
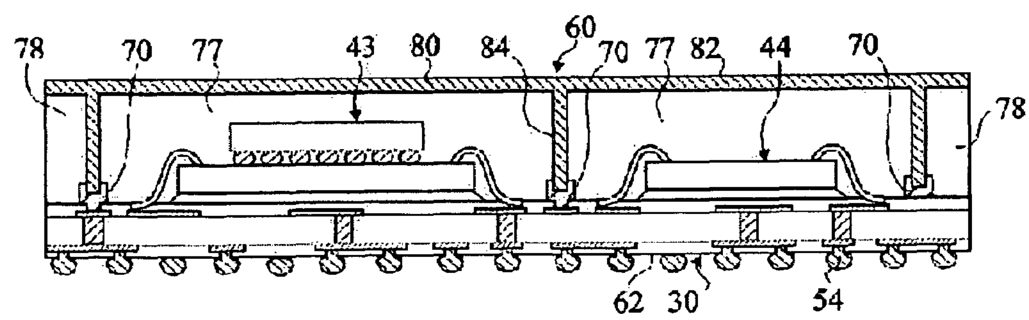

FIG. 13 shows the structure obtained after sawing of support 30, of resin blocks 78, and of metal layer 79 to obtain distinct electronic circuits 60, a single circuit 60 being shown. The sawing of support 30 may be performed by means of a circular saw having a thickness, for example, on the order of 100 μm. The sawing is performed at the level of intervals 74, between two adjacent conductive strips 70. As for the first example of embodiment, each electronic circuit 60 is formed of a portion 62 of support 30 on which are attached circuits 43 and 44, each circuit being surrounded with a metal cage 80, 82 corresponding to a portion of metal layer 78. In the second example of embodiment, metal cages 80, 82 have a common wall 84 between the two circuits 43, 44.

For the two previously-described examples of embodiment, the protection of circuits 43, 44 formed on the same portion 62 of support 30 being performed by metal cages 64, 66, 80, 82, it is then no longer necessary, when portion 62 of the support is subsequently attached to a motherboard, to provide a metal cover encapsulating portion 62 of the support, which anyway would not protect each circuit 43, 44 attached to support portion 62 against electromagnetic disturbances transmitted by the other circuit 43, 44 attached to the same support portion 62. For a circuit 60 of given dimensions, the implementation of the protection device according to the present invention results in a smaller bulk than that which results from the use of a distinct metal cover. Indeed, the bulk of the protection device according to the present invention results from the addition of metal layer 56, 79, generally having a thickness on the order of a few micrometers. When a distinct metal cover is used, it is generally necessary to provide a free space greater than one millimeter above circuit 60 to enable arrangement of the protection metal cover.

Further, the present invention enables proper setting of metal cages 64, 66, 80, 82 to the motherboard ground. Indeed, conductive strips 41, 70 may be connected to conductive tracks 36 at many points distributed along their entire length, and especially at the level of the conductive track which separates circuits 43, 44, enabling balanced distribution of the voltages.

In the first example of embodiment a free space may further be left between metal cages 64, 66 which then only are in contact at the level of conductive strip 41 extending between circuits 43, 44. Such a structure advantageously enables for resin blocks 55 to deform differently. Such a difference may then be due to differential expansions of resin blocks 55 when the amounts of heat released by circuits 43, 44 are different.

The present invention provides a method for protecting electronic circuits which advantageously causes few modifications with respect to a conventional electronic circuit manufacturing method. Indeed, the only step which requires using specific means is the step of forming of metal layer 56, 79 on resin layer 52. Conductive strips 41, 70 may be formed at the step, generally already present, of forming pads intended to be connected to discreet components. Further, the step of forming recesses 53, 76 may be implemented by sawing by means of a circular saw, such a sawing method being already conventionally implemented for the delimiting of circuits 60 by sawing of support 30.

Of course, the present invention is likely to have various alterations, modifications, and improvements which will readily occur to those skilled in the art. In particular, the present invention has been described for the protection of electronic circuits formed on a same BGA package. However, the present invention also relates to the protection of electronic circuits formed on a same LGA package and, more generally, to the protection of electronic circuits formed on a same support.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

I claim:

1. An electronic circuit device, comprising:

a support;

first and second circuit portions including first and second integrated circuit chips, respectively, the first and second circuit portions being covered respectively with first and second insulating blocks;

first and second metal cages respectively covering the first and second insulating blocks; and first and second conductive strip patterns formed on a first surface of the support and completely laterally surrounding the first and second circuit portions, respectively, the first and second metal cages being electrically connected to the first and second conductive strip patterns and being connected to the support via the conductive strip patterns, wherein the first and second insulating blocks are separated from each other by a recess, the first metal cage having a first wall positioned along a first side of the recess, the second metal cage having a second wall positioned along a second side of the recess, and the first and second conductive strip patterns sharing a common conductive strip positioned along a third side of the recess, the first and second walls being separated from one another and being electrically connected to each other and to the common conductive strip.

2. The device of claim 1, wherein the support comprises electrical connectors configured to electrically connect the metal cages to a terminal positioned on a second side of the support, opposite to the first side.

3. The device of claim 1, wherein the support comprises a planar insulating portion that includes the surface of the support and a second surface of the support, opposite to the first surface of the support, the device further comprising:

electrical connectors contained in the planar insulating portion;

first conductive tracks arranged on the first surface of the planar portion and second conductive tracks arranged on the second surface, the second conductive tracks being electrically connected to the first conductive tracks by the electrical connectors, the conductive strip patterns being in contact with at least one of the first conductive tracks, and at least one of the second conductive tracks, being configured to be connected to a source of a reference voltage.

4. The device of claim 1, wherein the support is a ball grid array.

5. A method for manufacturing an electronic circuit comprising the steps of:

providing a wafer;

attaching to the wafer first and second circuit portions including first and second integrated circuit chips, respectively;

covering the circuit portions with an insulating layer;

forming, in the insulating layer, recesses which surround each circuit portion and delimit respective first and second insulating blocks covering the first and second circuit portions, respectively, the recesses including a common recess between the first and second insulating blocks;

covering the insulating blocks with a metal layer that extends in the recesses surrounding each circuit portion, the metal layer forming first and second metal cages respectively covering the first and second insulating blocks, the first metal cage having a first wall positioned along a first side of the common recess, the second metal cage having a second wall positioned along a second side the common recess; and forming first and second conductive strip patterns on a first surface of the wafer, the first and second conductive strip patterns completely laterally surrounding the first and second circuit portions, respectively, the recesses being formed to expose the conductive strip portions, the first and second conductive strip patterns sharing a common conductive strip positioned along a third side of the common recess, the first and second walls being separated from one another and being electrically connected to each other and to the common conductive strip.

6. The method of claim 5, wherein the recesses are formed by sawing.

7. An electronic device protected against electromagnetic disturbances, comprising:

a first electronic circuit;

a support structure underlying the first electronic circuit, wherein the support structure includes a conductive structure;

an insulating block formed overlying the first electronic circuit on the support structure; and a metal layer overlying the insulating block and the first electronic circuit, wherein the metal layer is electrically connected to the support structure by the conductive structure, wherein the conductive structure includes conductive strips surrounding the first electronic circuit, the metal layer being connected to the support structure via the conductive strips, wherein the conductive strips form a continuous grid that completely laterally surrounds the first electronic circuit, wherein the support structure comprises:

a central layer of insulating material;

a first metal track on a first surface of the central layer;

a second metal track on a second surface of the central layer;

a metal via formed within the central aver for connecting the first metal track to the second metal track; and an upper insulating layer covering the first metal track; and a lower insulating layer covering the second metal track.

8. The device of claim 7 wherein the conductive structure is in electrical contact with the first metal track.

9. The device of claim 7 wherein the continuous grid is formed on a top surface of the support structure.

10. The device of claim 7 further comprising a second electronic circuit supported by the support structure, wherein the continuous grid completely laterally surrounds the first and second electronic circuits, the metal layer overlying the second electronic circuit and being connected to the support structure via the continuous grid.

11. An electronic device protected against electromagnetic disturbances comprising:

first and second electronic circuits;

a support structure supporting the first and second electronic circuits, wherein the support structure includes a conductive structure;

first and second insulating blocks formed overlying the first and second electronic circuits on the support structure, respectively; and a metal layer overlying the first and second insulating blocks that are formed over the first and second electronic circuits, wherein the metal layer is electrically connected to the support structure by the conductive structure, wherein the conductive structure includes conductive strips surrounding the first and second electronic circuits, the metal aver being connected to the support structure via the conductive strips, wherein the conductive strips form a continuous grid that completely laterally surrounds the first and second electronic circuits, wherein the support structure further comprises:

a central layer of insulating material;

a first metal track on a first surface of the central layer;

a second metal track on a second surface of the central layer;

a metal via formed within the central layer for connecting the first metal track to the second metal track; and an upper insulating layer covering the first metal track; and a lower insulating layer covering the second metal track.

12. The device of claim 11 wherein the metal via formed within the central layer for connecting the first metal track to the second metal track provides a conductive path between the metal layer and the support structure.

13. The device of claim 11 further comprising a reference terminal having a reference voltage and connected to the second metal track on the second surface of the central layer.

14. The device of claim 13 wherein the conductive path provides a connection of the metal layer to the reference terminal.

* * * * *

UNITED STATES PATENT AND TRADEMARK OFFICE
CERTIFICATE OF CORRECTION

PATENT NO. : 7,643,311 B2
APPLICATION NO. : 11/407854
DATED : January 5, 2010
INVENTOR(S) : Romain Coffy It is certified that error appears in the above-identified patent and that said Letters Patent is hereby corrected as shown below:

In the Claims:

Column 8, Line 56, Claim 7
"central aver for" should read -- central layer for --.

Column 9, Line 19, Claim 11
"metal aver being" should read -- metal layer being --.

Signed and Sealed this

Fifth Day of October, 2010

David J. Kappos
*Director of the United States Patent and Trademark Office*

UNITED STATES PATENT AND TRADEMARK OFFICE

CERTIFICATE OF CORRECTION

PATENT NO. : 7,643,311 B2
APPLICATION NO. : 11/407854
DATED : January 5, 2010
INVENTOR(S) : Romain Coffy It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 858 days.

Signed and Sealed this

Sixteenth Day of November, 2010

David J. Kappos
*Director of the United States Patent and Trademark Office*